United States Patent
Hsiao et al.

(10) Patent No.: US 9,490,254 B2
(45) Date of Patent: *Nov. 8, 2016

(54) FIN SIDEWALL REMOVAL TO ENLARGE EPITAXIAL SOURCE/DRAIN VOLUME

(71) Applicant: Taiwan Semiconductor Manufacturing Co., Ltd., Hsin-Chu (TW)

(72) Inventors: Ru-Shang Hsiao, Jhubei (TW); Chien-Hsun Lin, Kaohsiung (TW); Sheng-Fu Yu, Chiayi (TW); Yu-Chang Liang, Kaohsiung (TW); Kuan Yu Chen, Tainan (TW); Li-Yi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/880,454

(22) Filed: Oct. 12, 2015

(65) Prior Publication Data

US 2016/0035726 A1    Feb. 4, 2016

Related U.S. Application Data

(63) Continuation of application No. 14/225,912, filed on Mar. 26, 2014, now Pat. No. 9,159,812.

(51) Int. Cl.
*H01L 29/76* (2006.01)
*H01L 21/84* (2006.01)
(Continued)

(52) U.S. Cl.
CPC .......... *H01L 27/0886* (2013.01); *H01L 29/04* (2013.01); *H01L 29/0653* (2013.01);
(Continued)

(58) Field of Classification Search
CPC . H01L 21/84; H01L 21/845; H01L 21/8232; H01L 21/822; H01L 27/12; H01L 27/1211; H01L 27/0886; H01L 29/66795; H01L 29/66818; H01L 29/1033
USPC ........ 438/151, 154, 155, 161; 257/368, 369, 257/401
See application file for complete search history.

(56) References Cited

U.S. PATENT DOCUMENTS 8,927,373 B2    1/2015  Rodder et al.
9,159,812 B1 * 10/2015  Hsiao ............... H01L 29/66818
(Continued)

OTHER PUBLICATIONS

Notice of Allowance dated Jun. 9, 2015 for U.S. Appl. No. 14/225,912.

*Primary Examiner* — Kevin M Picardat
(74) *Attorney, Agent, or Firm* — Eschweiler & Associates, LLC (57) ABSTRACT

A FinFET device includes a dielectric layer formed over a semiconductor substrate and having an upper dielectric layer surface. A fin of semiconductor material extends upwards from the substrate through an opening in the dielectric layer. A base portion of the fin, which is recessed below the upper dielectric layer surface, includes a base channel region that separates first and second base source/drain regions. An upper channel region extends upwards from the base channel region and terminates in an upper fin surface disposed above the upper dielectric layer surface. A gate electrode straddles the upper channel region and is separated from the upper channel region by a gate dielectric. First and second epitaxial source/drain regions meet the first and second base source/drain regions, respectively, at first and second interfaces, respectively. The first and second interfaces are recessed in the opening and arranged below the upper dielectric layer surface.

20 Claims, 10 Drawing Sheets

(51) Int. Cl.
- *H01L 27/088* (2006.01)
- *H01L 29/66* (2006.01)
- *H01L 29/04* (2006.01)
- *H01L 29/06* (2006.01)
- *H01L 29/08* (2006.01)
- *H01L 29/78* (2006.01)

(52) U.S. Cl.
CPC ..... *H01L29/0847* (2013.01); *H01L 29/66795* (2013.01); *H01L 29/66818* (2013.01); *H01L 29/7848* (2013.01); *H01L 29/7853* (2013.01); *H01L 29/7854* (2013.01)

(56) References Cited

U.S. PATENT DOCUMENTS

| | | |
|---|---|---|
| 2011/0068407 A1 | 3/2011 | Yeh et al. |
| 2012/0032265 A1 | 2/2012 | Simonelli et al. |
| 2014/0070328 A1 | 3/2014 | Goto et al. |

* cited by examiner

FIN SIDEWALL REMOVAL TO ENLARGE EPITAXIAL SOURCE/DRAIN VOLUME

REFERENCE TO RELATED APPLICATION

This Application is a Continuation of U.S. application Ser. No. 14/225,912 filed on Mar. 26, 2014, the contents of which are incorporated by reference in their entirety.

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators can continue to overcome the technological challenges associated with it. In particular, one trend to increase transistor density in recent years is to go to nonplanar semiconducting devices—so called "FinFETs." FinFETs include a silicon fin, which includes source and drain regions that are separated by a channel region in the fin. A gate "wraps" around an upper surface and sidewalls of the channel region in the fin. This 3-dimensional channel structure increases the effective gate width of the FinFET over a planar FET, which allows for increased gate control of the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Conventional finFETs include a fin of semiconductor material that extends continuously between source/drain regions and a channel region, where a gate electrode extends over the channel region. In these conventional finFETs, a sidewall spacer extends about outer sidewalls of the fin from a base portion of the fin to an upper surface of the fin. Although this sidewall spacer protects the fin in some regards, it also constrains the volume of epitaxial source/drain regions that are formed on a top surface of the fin. Further, these sidewall spacers and fin region between the spacers place the epitaxial source/drain regions at a significant height above the substrate. This height can give rise to a large capacitance between an epitaxial source/drain region and an upper portion of the gate electrode or other conductive layers (e.g., metal 1 layer) over the epitaxial layer.

Accordingly, some embodiments of the present disclosure relate to techniques whereby an etch is carried out to reduce the height of the fin in the source/drain regions prior to the growth of epitaxial source/drain regions. This etch removes the sidewall spacers, and allows epitaxial source/drain regions to be grown with a larger volume, which can provide greater strain, more carriers during operation, and/or better electrical connectivity. In addition, by effectively lowering the top surface of the epitaxial source/drain regions compared to previous approaches, the etch tends to increase the distance between the top of the epitaxial source/drain regions and the top of the gate electrode, which can reduce capacitance and thereby improve device performance.

Figure 1A:
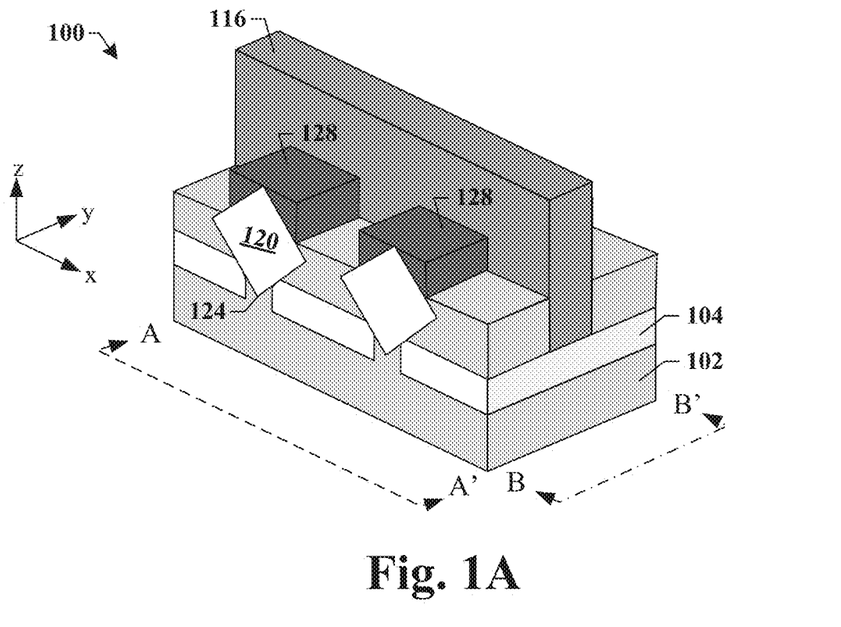
FIG. 1A illustrates a perspective view of a pair of FinFETs in accordance with some embodiments.
Figure 1B:
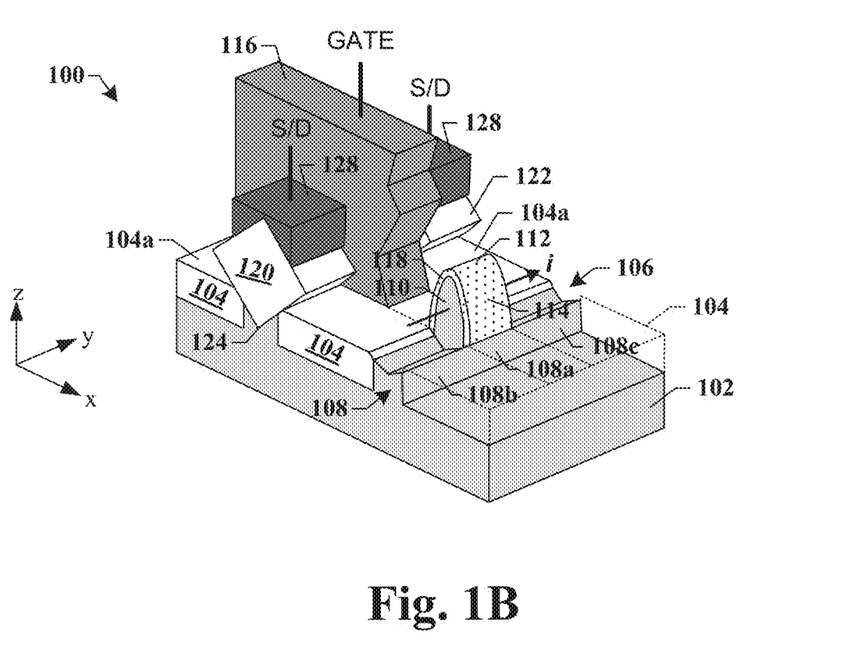
FIG. 1B illustrates a perspective view of a pair of FinFETs in accordance with some embodiments, where portions of a gate electrode and epitaxial source/drain regions are cut-away from one of the FinFETs to better illustrate a fin portion of the FinFET.
Figure 1C:
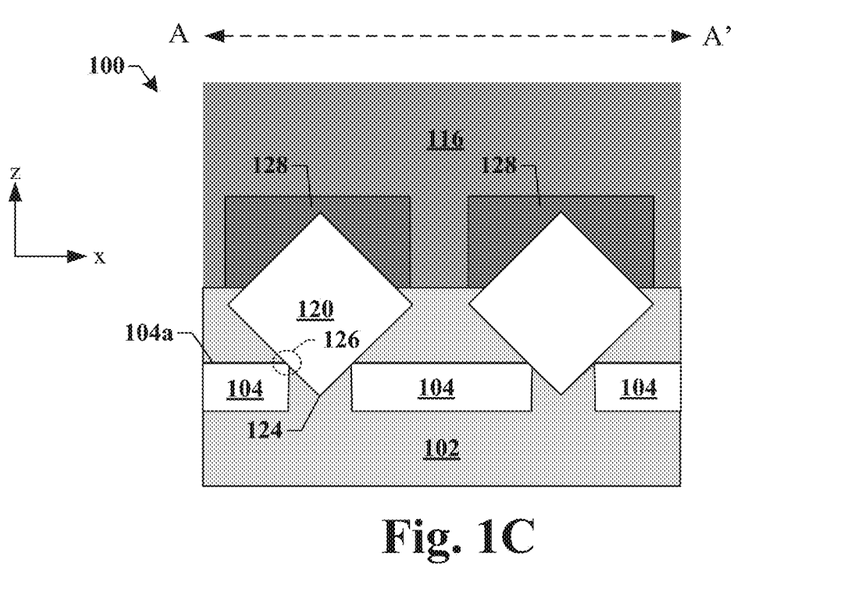
FIG. 1C illustrates a cross-sectional side view of a pair of FinFETs taken along line A-A' in FIG. 1A in accordance with some embodiments.
Figure 1D:
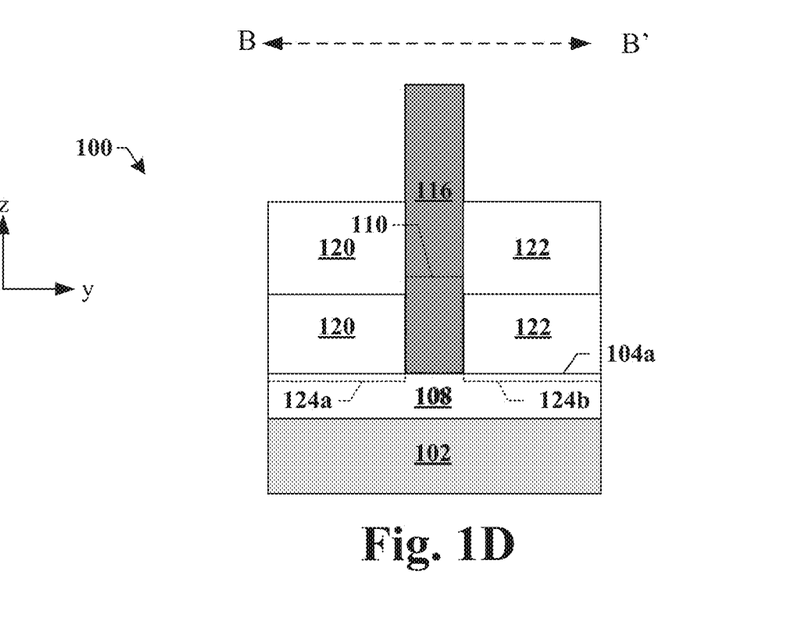
FIG. 1D illustrates a cross-sectional end view of a pair of FinFETs taken along line B-B' in FIG. 1A in accordance with some embodiments.

Referring now to FIGS. 1A-1D concurrently, one can see several views of an integrated circuit 100 which includes one or more FinFETs in accordance with some embodiments. In FIG. 1A-1B's perspective views, a pair of FinFETs are illustrated, however, it will be appreciated that ICs can include any number of finFET devices thereon and are in no way limited to the illustrated pair.

In FIGS. 1A-1D, the illustrated FinFETs are arranged on a semiconductor substrate 102, and a dielectric layer 104 having an upper dielectric layer surface 104a is arranged over the semiconductor substrate 102. As shown in FIG. 1B (which illustrates FIG. 1A's IC 100 with a portion of a gate electrode 116 and epitaxial source/drain regions cut-away), a fin 106 of semiconductor material extends upwards from the substrate 102 through an opening in the dielectric layer 104. A base portion 108 of the fin, which is recessed below an upper dielectric layer surface 104a, includes a base channel region 108a. The base channel region 108a separates first and second base source/drain regions 108b, 108c, and an upper channel region 110 extends upwards from the base channel region 108a. This upper channel region 110 terminates in an upper fin surface 112 disposed above the upper dielectric layer surface 104a. The base channel region 108a and upper channel region 110 exhibit a continuous sidewall 104 and cooperatively exhibit a rectangular, tapered, or rounded cross-section.

A gate electrode 116 straddles the upper channel region 110 and is separated from the upper channel region 110 by a gate dielectric 118. First and second epitaxial source/drain regions 120, 122 meet first and second base source/drain regions 108b, 108c, respectively, at first and second interfaces 124a, 124b, respectively. In FIGS. 1A-1D, the first and second interfaces 124a, 124b are recessed in the opening in the dielectric layer 104 and are arranged below the upper dielectric layer surface 104a. The dielectric layer 104 is tapered 126 near the first and second interfaces 124 to accommodate the epitaxial source/drain regions 120, 122, which have a diamond-shaped cross-section in the illustrated examples. Due to lattice constant mismatch between the epitaxial source/drain regions 120, 122 and the channel region 110, the first and second epitaxial source/drain regions 120, 122 exert strain on the channel region 110 to increase the mobility of carriers during device operation. Compressive or tensile strain can be induced depending on whether the FinFET is an n-type or p-type device.

In some embodiments, substrate 102 and fin 106 (which includes base fin 108 and upper channel region 110) are made of silicon, such as formed from a bulk silicon or silicon on insulator (SOI) substrate, and the epitaxial source/drain regions 120, 122 are made of germanium (Ge) or silicon-germanium (SiGe). In other embodiments, carbon doped silicon or other strain inducing materials can alternatively be used to form the epitaxial source/drain regions 120, 122. Whatever the precise materials used, a lattice constant mismatch between a first material used for epitaxial source/drain regions 120, 122 and a second material used for the semiconducting fin 106 causes strain to be induced in the channel region 110.

A source/drain contact 128 contacts an epitaxial source/drain region 120 on upper surface of the diamond-shaped cross-section. Although the illustrated source/drain contact 128 contacts an epitaxial source/drain region on an upper surface of the diamond-shaped cross-section without extending along a lower surface of the diamond-shaped cross-section, in other embodiments source drain contacts 128 can wrap around to be in contact with at least part of the lower surface of the diamond-shaped cross-section as well as the upper surface.

During device operation, a gate bias of greater than a threshold voltage ($V_T$) can be selectively applied to the gate electrode 116, which induces accumulation of charge or depletion in the channel region 110 under the gate electrode 116. While the gate bias is applied, a bias can be selectively applied across the source/drain regions (S/D) to cause current (i) to flow between source/drain regions—a so called "on state". On the other hand, if the gate bias is less than $V_T$, then no current will flow between epitaxial source/drain regions 120; 122 even if a suitable source/drain bias is applied—so called "off state" or sub-threshold state.

Note that although reference numeral 108a is referred to as 'the base channel region', it will be appreciated that during operation, it is not necessary that a conductive channel actually extend downward into this region (although this may occur in some embodiments depending on the applied biases). In other embodiments, the conductive channel formed during operation tends to remain or, in fact, remains, in the upper channel region 110 without extending into the base channel region 108a.

Figure 1E:
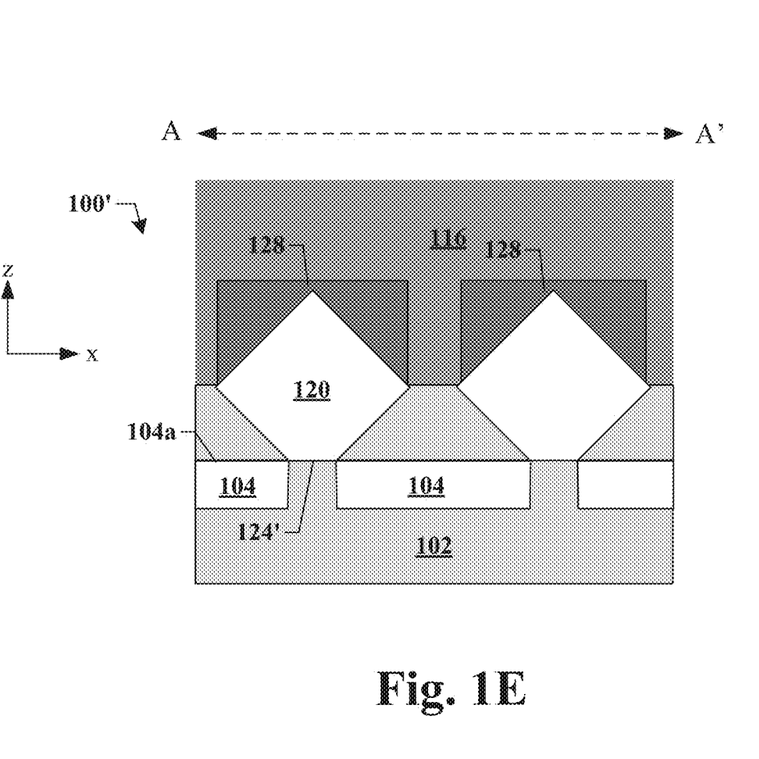
FIG. 1E illustrates an alternative cross-sectional side view of a FinFET taken along line A-A' in FIG. 1A in accordance with some embodiments.

Whereas FIGS. 1A-1D illustrate the first and second interfaces 124 being recessed in the opening of the dielectric layer 104 and arranged below the upper dielectric layer surface 104a, FIG. 1E shows an alternative embodiment where the first and second interfaces 124a' are co-planar with the upper dielectric layer surface 104a. As will be appreciated in more detail below, this structure still has epitaxial source/drain regions which are formed on base source/drain regions that have been formed by removing an upper sacrificial portion of a fin. Hence, the epitaxial source/drain regions are lower than conventional epitaxial source/drain regions and can offer improved performance in some regards. In some other embodiments, the first and second interfaces 124a' could even be left above the upper dielectric layer surface 104a after a sacrificial portion of the fin is etched back. For example, fifty percent or even seventy five percent of the original upper fin height can be removed when the sacrificial portion of the fin is etched back leaving a portion of the upper fin portion in place and leaving the entire lower portion in place, thereby giving rise to the first and interfaces that are slightly above the upper dielectric layer surface 104a.

Figure 2:
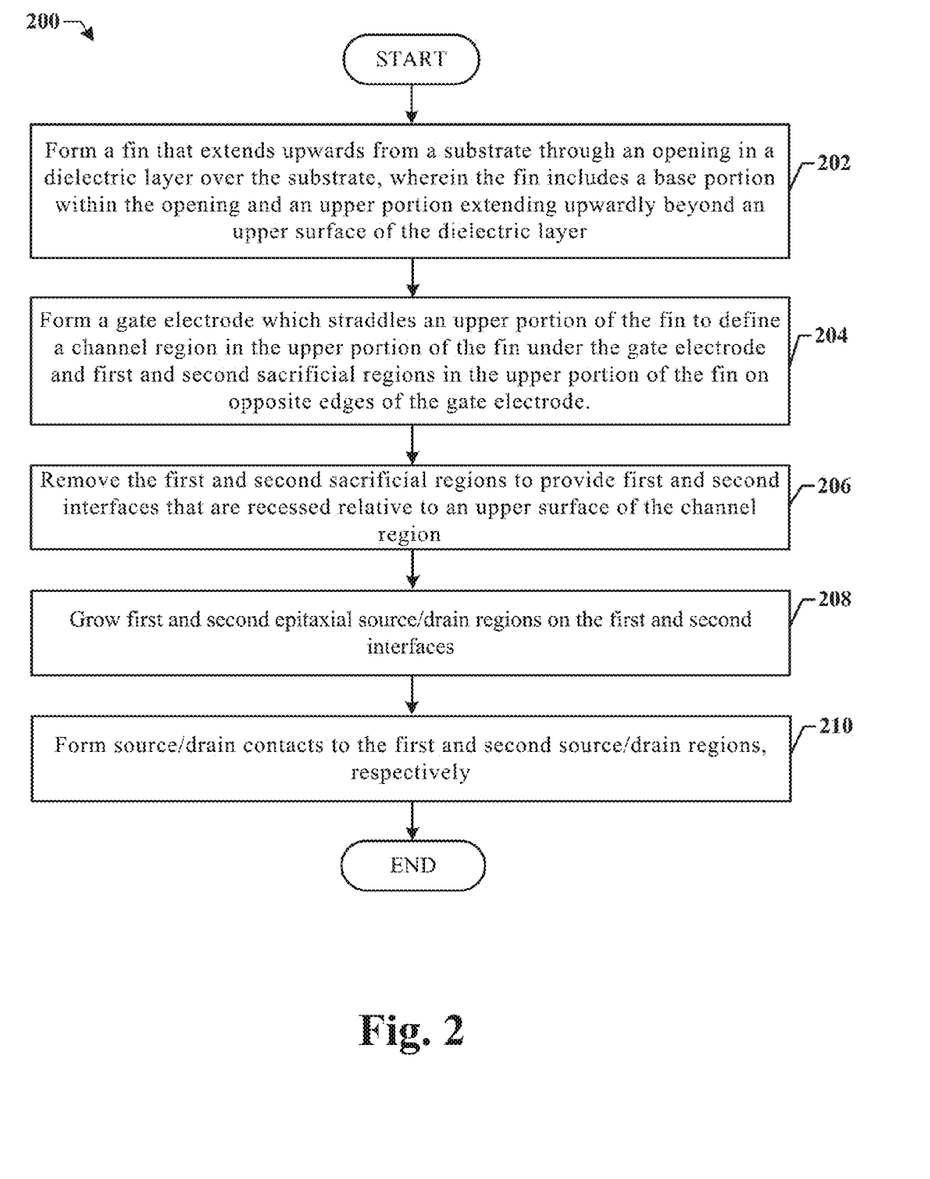
FIG. 2 illustrates a method of forming a FinFET in flow chart format in accordance with some embodiments.

FIG. 2 illustrates a method 200 of forming a FinFET in accordance with some embodiments. Although this method is depicted as a series of blocks, it will be appreciated that methods in accordance with this disclosure are not limited to the illustrated blocks and/or the illustrated ordering of the illustrated blocks. Thus, in some embodiments, additional un-illustrated steps may be present, and/or blocks illustrated herein may be left out.

At 202 a semiconducting fin is formed that extends upwards from a substrate through an opening in a dielectric layer over the substrate. The fin includes a base portion within the opening and an upper portion extending upwardly beyond an upper surface of the dielectric layer.

At 204 a gate electrode is formed. This gate electrode straddles an upper portion of the fin to define a channel region in the upper portion of the fin under the gate electrode. First and second sacrificial fin regions are also defined in the upper portion of the fin on opposite edges of the gate electrode.

At 206 the first and second sacrificial fin regions are removed from opposite sides of the gate electrode to provide first and second interfaces that are recessed relative to an upper surface of the channel region.

At 208 first and second epitaxial source/drain regions are grown on the first and second interface surfaces.

At 210 first and second source/drain contacts are formed to contact to the first and second source/drain regions, respectively. Back-end-of-line (BEOL) metallization can then be carried out to build electrical interconnect for the integrated circuit.

FIGS. 3A-3C, 4A-4C, 5A-5C, 6A-6C, 7A-7C, and 8A-8C illustrate a series of cross-sectional views that collectively depict some embodiments of forming a FinFET in accordance with some embodiments.

Figure 3A:
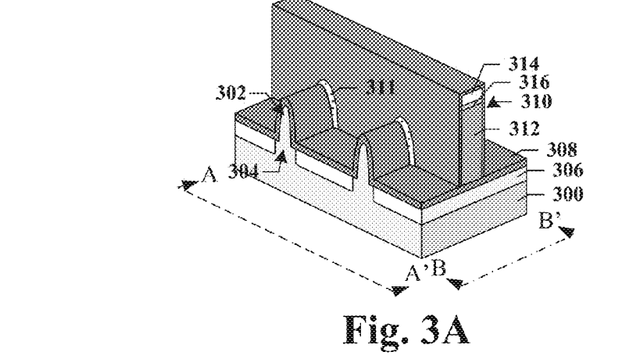
FIGS. 3A-3C through 8A-8C collectively illustrate a method for manufacturing a FinFET as a series of perspective and cross-sectional views at various stages in the manufacturing process.
Figure 3B:
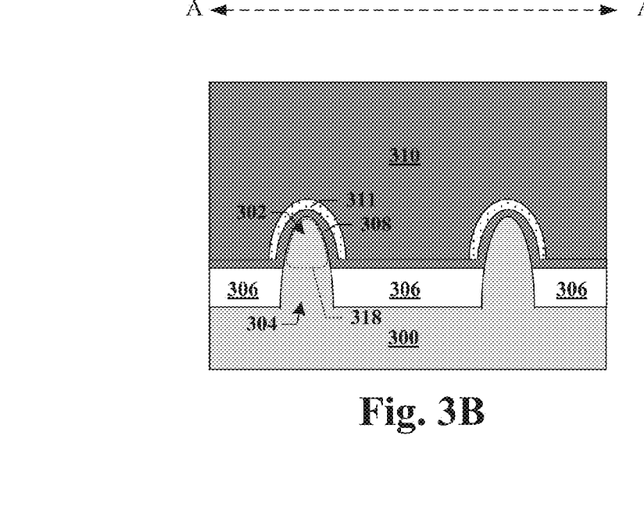
Figure 3C:
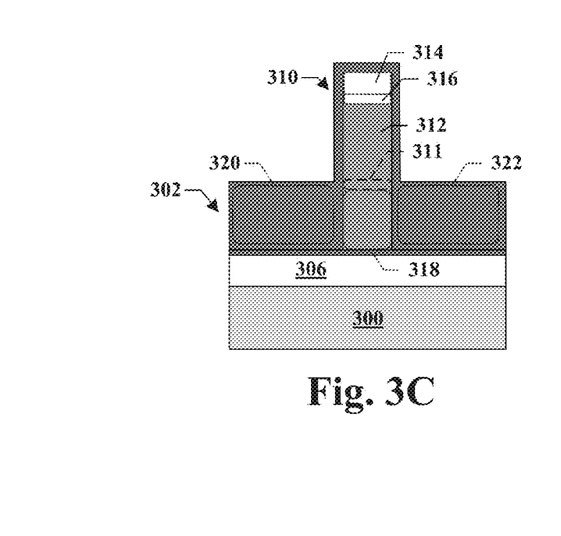

FIGS. 3A-3C illustrate a semiconductor substrate 300 that includes a fin 302 of semiconductor material extending upwards through an opening 304 in a dielectric layer 306 over the substrate 300. In some embodiments, the substrate 300 is silicon, such as a bulk silicon substrate or silicon on insulator (SOI) substrate, and the dielectric layer 306 is an oxide material, such as a shallow trench isolation region or buried oxide region that laterally surrounds individual fins and separates the individual fins from one another. A protective outer sidewall layer 308, such as a SiN layer or TiN layer, can be formed over sidewalls of fin 302 and over an upper surface of the fin 302, as well as over surfaces of the structure. A conductive gate electrode 310 can straddle the fin 304 and is separated from the fin 304 by a gate dielectric

311. In some embodiments, the gate electrode 310 can be made of polysilicon 312, and an oxide layer 314 and SiN layer 316 can be disposed near an upper surface of the gate electrode 310. The gate electrode 310 straddles an upper portion of the fin 302 to define a channel region 318 (FIG. 3C) in the upper portion of the fin under the gate electrode 310. First and second sacrificial fin regions 320, 322 (FIG. 3C) are also defined in the upper portion of the fin on opposite edges of the gate electrode 310. The fin 304 has a continuous upper surface extending through the first and second sacrificial fin region 320, 322 and through the channel region 318.

Figure 4A:
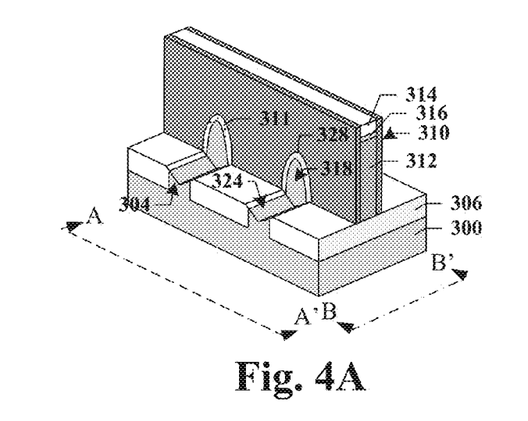
Figure 4B:
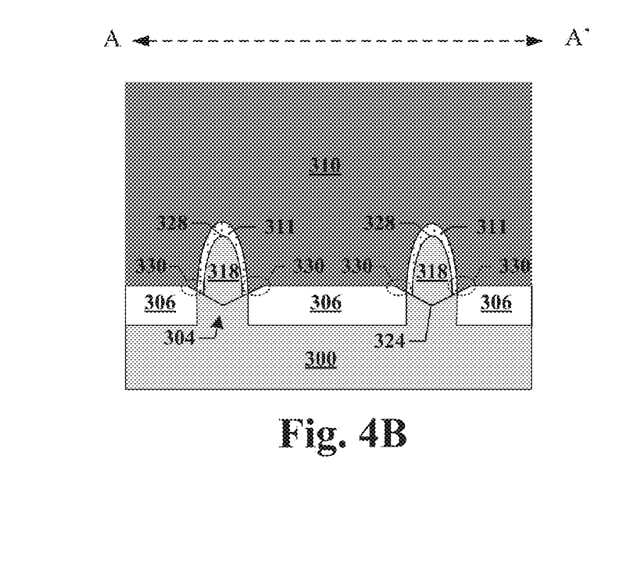
Figure 4C:
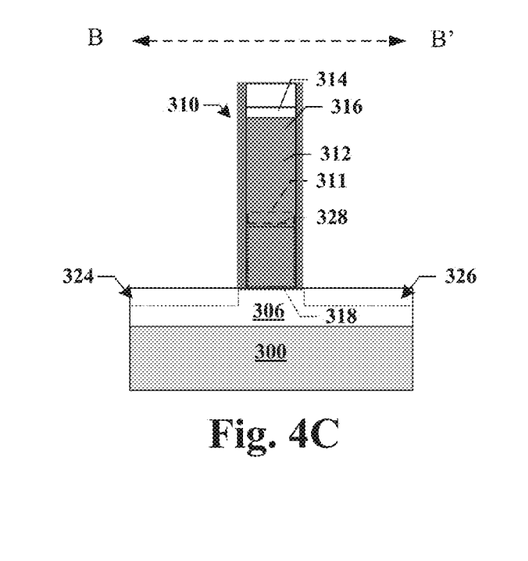

In FIGS. 4A-4C, the first and second sacrificial fin regions 320, 322 are removed to provide first and second interfaces 324, 326 that are recessed relative to an upper surface 328 of the channel region. In the illustrated embodiment, the first and second interfaces 324, 326 are substantially v-shaped surfaces to promote suitable growth for subsequent formation of epitaxial source/drain regions to induce strain on channel region 318. Further, to allow for these subsequently formed epitaxial source/drain regions to have a large volume, an upper corner of the dielectric layer adjacent to the opening is removed to give rise to a tapered surface 330 (FIG. 4C).

Figure 5A:
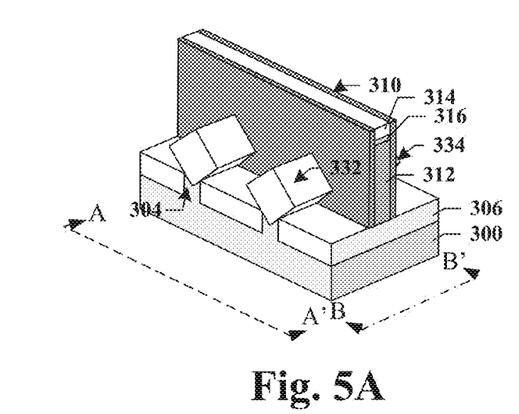
Figure 5B:
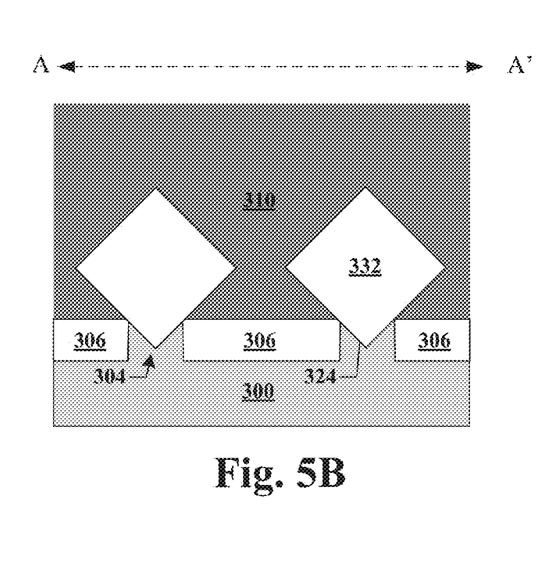
Figure 5C:
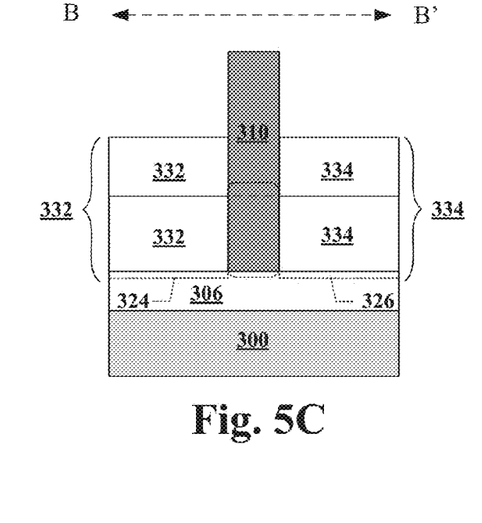

In FIGS. 5A-5C, first and second epitaxial source/drain regions 320, 322 are grown on the first and second interfaces 324, 326. These first and second epitaxial source/drain regions 332, 334 have diamond-shaped cross-sections, and can be grown by cyclic deposition/etch (CDE) processes. In some embodiments, the epitaxial source/drain regions 332, 34 are made of germanium (Ge) or silicon-germanium (SiGe). In other embodiments, carbon doped silicon or other strain inducing materials can alternatively be used to form the epitaxial source/drain regions 332, 334. Whatever the precise materials used, a lattice constant mismatch between a first material used for epitaxial source/drain regions 332, 334 and a second material used for the semiconducting fin 302 causes strain to be induced in the channel region 318.

Figure 6A:
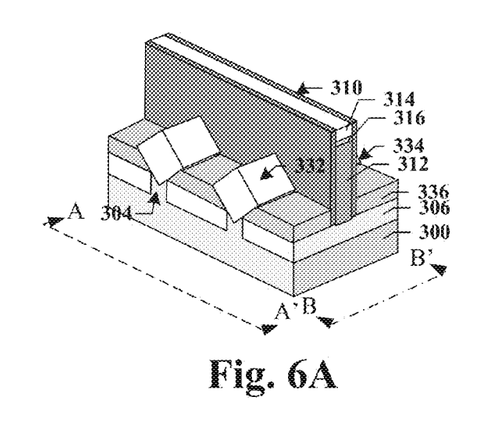
Figure 6B:
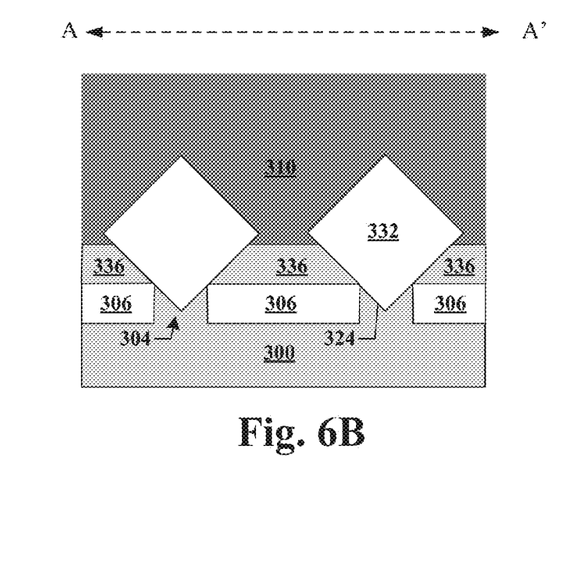
Figure 6C:
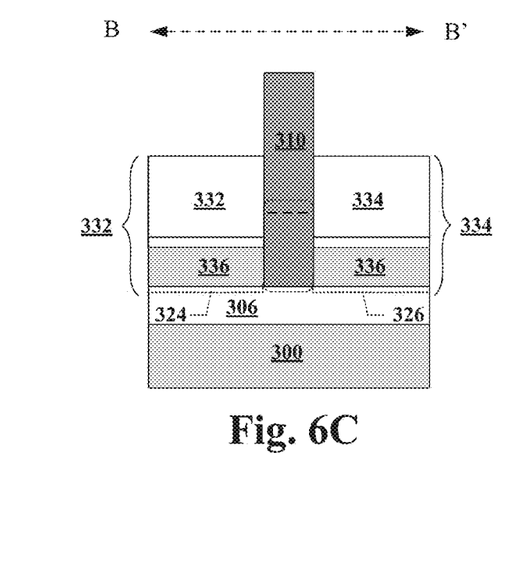

In FIGS. 6A-6C, a dielectric layer 336 is formed around lower surfaces of the diamond-shaped epitaxial source/drain regions.

Figure 7A:
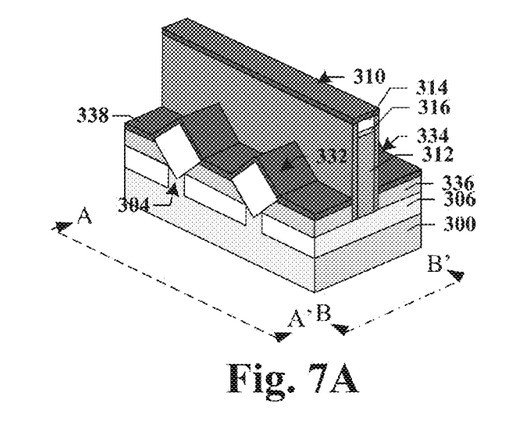
Figure 7B:
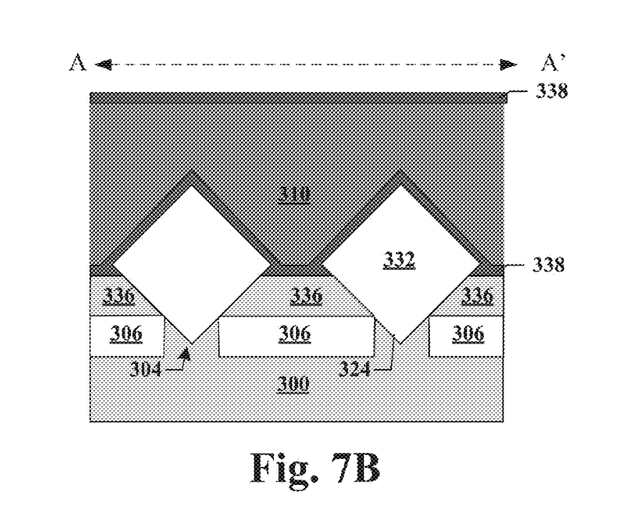
Figure 7C:
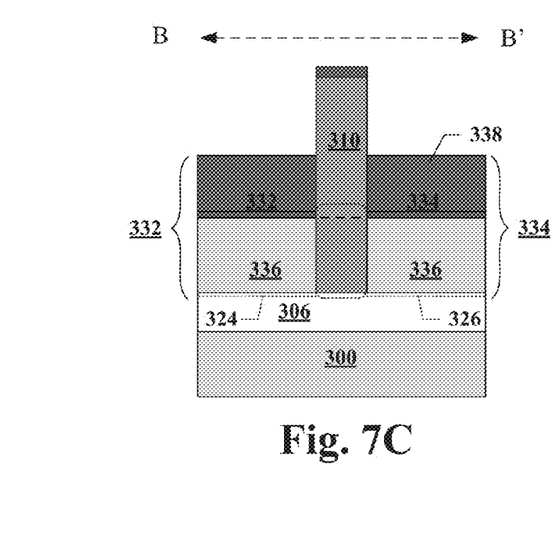

In FIGS. 7A-7C, a contact etch stop layer (CESL) 338 is formed over the dielectric layer 336.

Figure 8A:
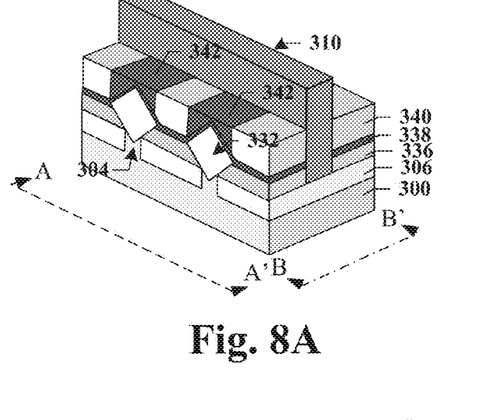
Figure 8B:
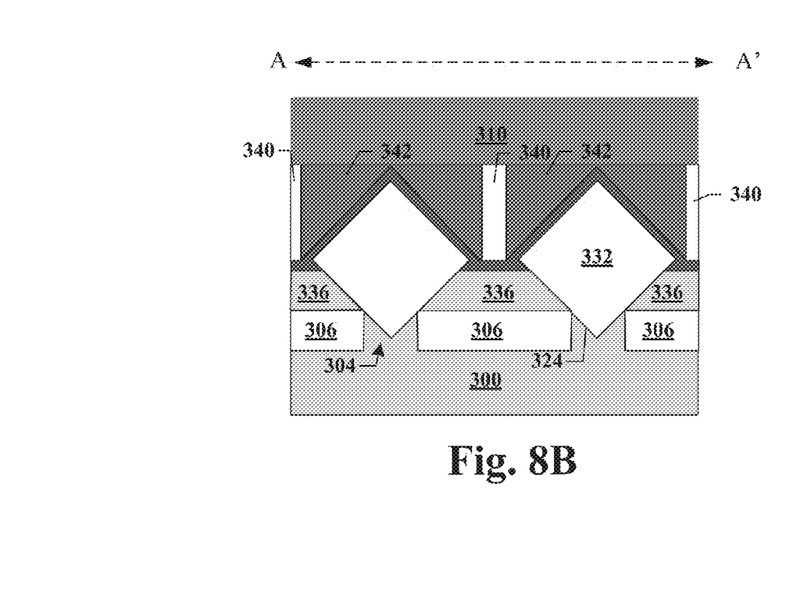
Figure 8C:
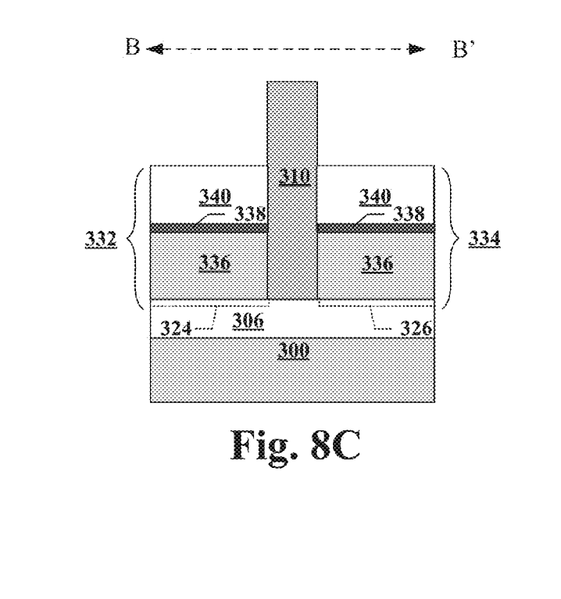

In FIGS. 8A-8C, an interlayer dielectric (ILD) 340, such as a low-k dielectric layer or extreme low-k dielectric layer is formed over the epitaxial source/drain regions. An ILD mask (not shown) is then patterned over the ILD 340 to cover some portions of the ILD while leaving other portions of the ILD exposed. An etch, which is selective between the ILD 340 and CESL 338, is performed with the ILD mask in place to remove the exposed portions of the ILD and provide recesses which terminate at upper surfaces of CESL over the diamond-shaped epitaxial source/drain regions. A conductive contact material is the formed in these recesses to establish first and second source/drain contacts 342. Although not shown, vias and higher level metal layers can also be formed during back-end-of-line (BEOL) processing to build electrical interconnect for the integrated circuit.

Accordingly, some embodiments of the present disclosure relate to techniques whereby an etch is carried out to reduce the height of the fin in the source/drain regions prior to the growth of epitaxial source/drain regions. This etch removes the sidewall spacers, and allows epitaxial source/drain regions to be grown with a larger volume, which can provide greater strain, more carriers during operation, and/or better electrical connectivity. In addition, by effectively lowering the top surface of the epitaxial source/drain regions compared to previous approaches, the etch tends to increase the distance between the top of the epitaxial source/drain regions and the top of the gate electrode, which can reduce capacitance and thereby improve device performance.

More particularly, some embodiments relate to a FinFET device that includes a dielectric layer formed over a semiconductor substrate and having an upper dielectric layer surface. A fin of semiconductor material extends upwards from the substrate through an opening in the dielectric layer. A base portion of the fin, which is recessed below the upper dielectric layer surface, includes a base channel region that separates first and second base source/drain regions. An upper channel region extends upwards from the base channel region and terminates in an upper fin surface disposed above the upper dielectric layer surface. A gate electrode straddles the upper channel region and is separated from the upper channel region by a gate dielectric. First and second epitaxial source/drain regions meet the first and second base source/drain regions, respectively, at first and second interfaces, respectively. The first and second interfaces are recessed in the opening and arranged below the upper dielectric layer surface.

Other embodiments relate to a method. In this method, a fin is formed to extend upwards from a substrate through an opening in a dielectric layer over the substrate. The fin includes a base portion within the opening and an upper portion extending upwardly beyond an upper surface of the dielectric layer. A gate electrode is formed to straddles an upper portion of the fin to define a channel region in the upper portion of the fin under the gate electrode. First and second sacrificial regions are defined in the upper portion of the fin on opposite edges of the gate electrode. The first and second sacrificial regions are removed to provide first and second interfaces that are recessed relative to an upper surface of the channel region. First and second epitaxial source/drain regions are formed on the first and second interfaces.

Still other embodiments relate to an integrated circuit that includes one or more FinFET devices. A FinFET device includes a dielectric layer formed over a semiconductor substrate and having an upper dielectric layer surface. A fin of semiconductor material extends upwards from the substrate through an opening in the dielectric layer. A base portion of the fin, which is recessed below an upper dielectric layer surface, includes a base channel region that separates first and second base source/drain regions. An upper channel region extends upwards from the base channel region and terminates in an upper fin surface disposed above the upper dielectric layer surface. A gate electrode straddles the upper channel region and is separated from the upper channel region by a gate dielectric. First and second epitaxial source/drain regions meet the first and second base source/drain regions, respectively, at first and second interface surfaces, respectively. The first and second interface surfaces are aligned near the upper dielectric layer surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may

What is claimed is:

1. An integrated circuit, comprising:
a semiconductor substrate;
a dielectric layer disposed over the semiconductor substrate;
a semiconductor fin extending upwardly from the semiconductor substrate through an opening in the dielectric layer, wherein a base portion of the semiconductor fin is surrounded by sidewalls of the opening and an upper portion of the semiconductor fin extends out of the opening and is disposed directly on the base portion of the fin;
a gate electrode straddling the upper portion of the semiconductor fin and separated from the upper portion of the semiconductor fin by a gate dielectric; and
first and second source/drain regions disposed directly on the base portion of the semiconductor fin on opposite sides of the gate electrode, wherein the first and second source/drain regions are spaced apart from one another by the upper portion of the fin and have respective lower surfaces that extend below an upper surface of the dielectric layer.

2. The integrated circuit of claim 1, wherein the lower surfaces of the first or second source/drain regions meet the base portion of the semiconductor fin at a substantially v-shaped interface.

3. The integrated circuit of claim 1, wherein the dielectric layer has tapered upper sidewalls at an upper portion of the opening to widen the opening near the upper surface of the dielectric layer, wherein the tapered upper sidewalls are in direct contact with lower surfaces of the first and second source/drain regions.

4. The integrated circuit of claim 1, wherein the first and second source/drain regions have inclined lower surfaces in direct contact with the dielectric layer and non-perpendicular with regards to the upper surface of the dielectric layer.

5. The integrated circuit of claim 1, further comprising:
a source/drain contact that contacts the first or second source/drain regions on an inclined upper surface of the first or second source/drain regions.

6. The integrated circuit of claim 1, wherein the base portion of the semiconductor fin exhibit a first lattice constant, and wherein the first and second source/drain regions exhibit a second lattice constant that is different from the first lattice constant.

7. The integrated circuit of claim 1, wherein the base portion and the upper portion of the semiconductor fin exhibit a continuous lattice structure and cooperatively exhibit a rectangular, tapered, or rounded cross-section under the gate electrode.

8. An integrated circuit, comprising:
a dielectric layer disposed over a substrate and having an upper dielectric layer surface;
a semiconductor fin extending upwards from the substrate through an opening in the dielectric layer, comprising:
a base portion below the upper dielectric layer surface including first and second base source/drain regions separated by a base channel region, and an upper portion including an upper channel region disposed directly on the base channel region; and
first and second source/drain regions disposed directly on the first and second base source/drain regions, wherein the first and second source/drain regions respectively have a diamond-shaped cross-section with inclined upper and lower surfaces meet at a tip disposed above the upper dielectric layer surface.

9. The integrated circuit of claim 8, wherein the first and second source/drain regions meet the first and second base source/drain regions at first and second interface surfaces, respectively, wherein the first and second interface surfaces are aligned near the upper dielectric layer surface.

10. The integrated circuit of claim 8, wherein the first and second source/drain regions meet the first and second base source/drain regions at first and second interfaces, respectively, wherein the first and second interfaces are recessed in the opening and arranged below the upper dielectric layer surface.

11. The integrated circuit of claim 8, wherein the inclined lower surfaces of the first and second source/drain regions meet the dielectric layer at an acute angle relative to the upper dielectric layer surface.

12. The integrated circuit of claim 11, wherein an interface of the first or second source/drain regions and the dielectric layer connects the upper dielectric layer surface and a lower sidewall of the opening and is inclined relative to the upper dielectric layer surface and the lower sidewall.

13. The integrated circuit of claim 8, further comprising:
a source/drain contact that contacts the first or second source/drain regions on the upper surface of the diamond-shaped cross-section without extending across the tip or along the lower surface of the diamond-shaped cross-section.

14. The integrated circuit of claim 8, further comprising:
a gate electrode straddling the semiconductor fin from the upper dielectric layer surface along the channel region and being separated from the channel region by a gate dielectric.

15. The integrated circuit of claim 14, further comprising:
a protection layer disposed along sidewalls of the gate electrode and having a bottom surface on the upper dielectric layer surface and a top surface aligned with a top surface of the gate electrode.

16. An integrated circuit that includes one or more FinFET devices, a FinFET device comprising:
a dielectric layer disposed over a substrate and having an upper dielectric layer surface;
a semiconductor fin extending upwards from the substrate through an opening in the dielectric layer, comprising:
a base portion below the upper dielectric layer surface including first and second base source/drain regions separated by a base channel region, and an upper portion including an upper channel region disposed directly on the base channel region; and
first and second source/drain regions disposed directly on the first and second base source/drain regions, wherein the first and second source/drain regions respectively have an inclined lower surface with a single slope, extending continuously from a lowest position of the first or second source/drain regions below the upper dielectric layer surface to a widest position above the upper dielectric layer surface.

17. The integrated circuit of claim 16, wherein the first and second base source/drain regions exhibit a first lattice constant, and wherein the first and second source/drain regions exhibit a second lattice constant that is different from the first lattice constant to introduce strain into the channel region.

18. The integrated circuit of claim 16, further comprising:
a source/drain contact disposed on an inclined upper surface of the first and second source/drain regions that extends continuously from a widest position to a highest position of the source/drain regions, the source/drain contact is separated from an etch stop layer covering the upper surface of the first and second source/drain regions.

19. The integrated circuit of claim 16, wherein inclined lower surface contacts a tapered upper sidewall of the opening near the upper dielectric layer surface, wherein the tapered upper sidewall connects the upper dielectric layer surface and a lower sidewall of the opening that has a right angle relative to the upper dielectric layer surface.

20. The integrated circuit of claim 19, wherein the inclined lower surface of the first and second source/drain regions meets the first and second base source/drain regions, respectively, at V-shaped first and second interfaces, respectively, wherein the V-shaped first and second interfaces are aligned with the tapered upper sidewall of the opening.

* * * * *